United States Patent [19]

Shibayama et al.

[11] 4,293,819
[45] Oct. 6, 1981

[54] HIGH-SPEED LOW-DRIFT OPERATIONAL AMPLIFIER

[75] Inventors: Akinori Shibayama, Shakujiidai; Kenji Maio, Hinode; Norio Yokozawa, Fuchu, all of Japan

[73] Assignees: Nippon Telegraph and Telephone Public Corporation; Hitachi, Ltd., both of Tokyo, Japan

[21] Appl. No.: 76,428

[22] Filed: Sep. 17, 1979

[30] Foreign Application Priority Data

Sep. 20, 1978 [JP] Japan ................................ 53-114629

[51] Int. Cl.³ .............................................. H03F 1/02
[52] U.S. Cl. ..................................................... 330/9
[58] Field of Search ............................................ 330/9

[56] References Cited

U.S. PATENT DOCUMENTS

| 2,801,296 | 7/1957 | Blecher | 330/9 |
| 3,573,644 | 4/1971 | Evel | 330/9 |
| 3,737,798 | 6/1973 | Faraguet | 330/9 |

Primary Examiner—Harold A. Dixon
Attorney, Agent, or Firm—Craig and Antonelli

[57] ABSTRACT

A high-speed low-drift operational amplifier is disclosed in which a coefficient circuit having a voltage gain of more than 1 is formed employing a low frequency operational amplifier with a low-drift characteristic to multiply an input voltage by the voltage gain, the coefficient circuit and a low pass filter are connected in cascade to form a drift compensating circuit, and the inverting and non-inverting input terminals of a wide-band operational amplifier are connected to the input and output terminals of the drift compensating circuit, respectively.

5 Claims, 6 Drawing Figures

HIGH-SPEED LOW-DRIFT OPERATIONAL AMPLIFIER

BACKGROUND OF THE INVENTION

1. Field of the Invention

The present invention relates to an operational amplifier, and more particularly to a high-speed low-drift operational amplifier having a frequency band of 0 to 100 MHz and a temperature coefficient of offset voltage of about 1.2 $\mu V/°C$.

2. Description of the Prior Art

A chopper-type circuit such as shown in FIG. 1 of the accompanying drawings has been widely employed as a high-speed low-drift operational amplifier. Referring to FIG. 1, a high frequency component of an input signal $e_i$ applied to an input terminal 1 is amplified by a high-speed operational amplifier 6, and a low frequency component of the input signal is amplified by a low-drift amplifier 9 which is made up of a chopper circuit 2, an a.c. amplifier 3, a synchronous rectifier 4 and a smoothing circuit 5. Thus, the circuit shown in FIG. 1 can produce, on the whole, an output signal $e_o$ having a high-speed low-drift characteristic, which is delivered from an output terminal 7. In the low-drift amplifier 9, the following operations are performed. The input signal $e_i$ is converted by the chopper circuit 2 into a square wave signal, namely, an a.c. signal, which is amplified by the amplifier 3 and then detected by the snychronous rectifier 4. The square wave signal delivered from the rectifier 4 is smoothed by the smoothing circuit 5. Respective switches of the chopper circuit 2 and the synchronous rectifier 4 are supplied with an on-off signal which is generated by a square wave generator 8. In the circuit shown in FIG. 1, the chopper noise resulting from the make and break of the switch which is effected by the output of the square wave generator 8, has frequently come into question. Further, the above circuit is complicated in construction, and cannot perform a differential operation in the input thereof.

SUMMARY OF THE INVENTION

An object of the present invention is to provide a novel high-speed low-drift operational amplifier which can solve the above-mentioned problems encountered with the conventional operational amplifier.

In order to attain the above and other objects, according to the present invention, there is provided a high-speed low-drift operational amplifier in which a low-frequency operational amplifier having a low-drift characteristic is connected at the inverting input terminal thereof to both a resistor and one end of a feedback circuit, and is connected at the output terminal to the other end of the feedback circuit, to be used as an inverting amplifier having a voltage gain $G_1$ more than 1 (usually lying within a range from 10 to 100), namely, as a coefficient circuit for multiplying an input voltage by a coefficient $G_1$, in which a drift compensating circuit is made up of the coefficient circuit and a low pass filter cascade-connected with the coefficient circuit, and in which the inverting and non-inverting input terminals of a wide-band operational amplifier are connected to the input and output terminals of the drift compensating circuit, respectively.

In the above-mentioned circuit arrangement, the inverting input terminal of the wide-band operational amplifier and the non-inverting input terminal of the low frequency operational amplifier correspond respectively to the inverting and non-inverting input terminals of a high-speed low-drift operational amplifier according to the present invention.

DESCRIPTION OF THE PREFERRED EMBODIMENTS

Figure 2:
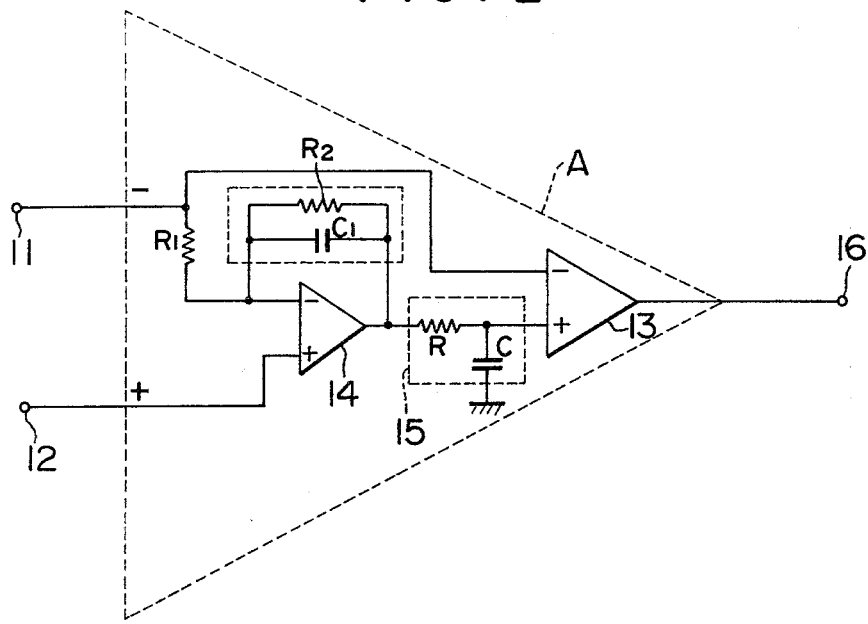
FIG. 2 is a circuit diagram of an embodiment of an operational amplifier according to the present invention.

Now, explanation will be made on an embodiment of an operational amplifier according to the present invention by reference to FIG. 2. In FIG. 2, reference numerals 11 and 12 designate differential input terminals, 13 a wide-band operational amplifier having relatively large voltage-offset and drift values (a combined value of which can be expressed in terms of an input value $ed_1$), 14 a low-frequency operational amplifier having sufficiently small voltage-offset and drift values (a combined value of which is expressed in terms of an input value $ed_2$) as compared with the amplifier 13, 15 a low pass filter, and 16 an output terminal. The low-frequency operational amplifier 14, resistors $R_1$ and $R_2$ and a capacitor $C_1$ make up a coefficient circuit having a transfer function g which is approximately expressed by the following equation:

$$g = \frac{R_2}{R_1} \times \frac{1}{1 + SC_1R_2} \qquad (1)$$

where S indicates an operator.

The voltage-offset and drift values generated by the circuit shown in FIG. 2 can be expressed in terms of an input value $ed_o$, which is approximately given by the following equation:

$$ed_0 \simeq ed_2 + \frac{ed_1}{g} \qquad (2)$$

where $|g| \gg 1$.

Next, a procedure for derivation of equation (2) will be explained below. Specifically, explanation will be made on a case where an operational amplifier A shown in FIG. 2 is employed as an inverting amplifier with the inverting input terminal 11 of the amplifier A connected to a series resistor $R_S$ and a feedback resistor $R_F$ and with the non-inverting input terminal 12 grounded.

Figure 3:
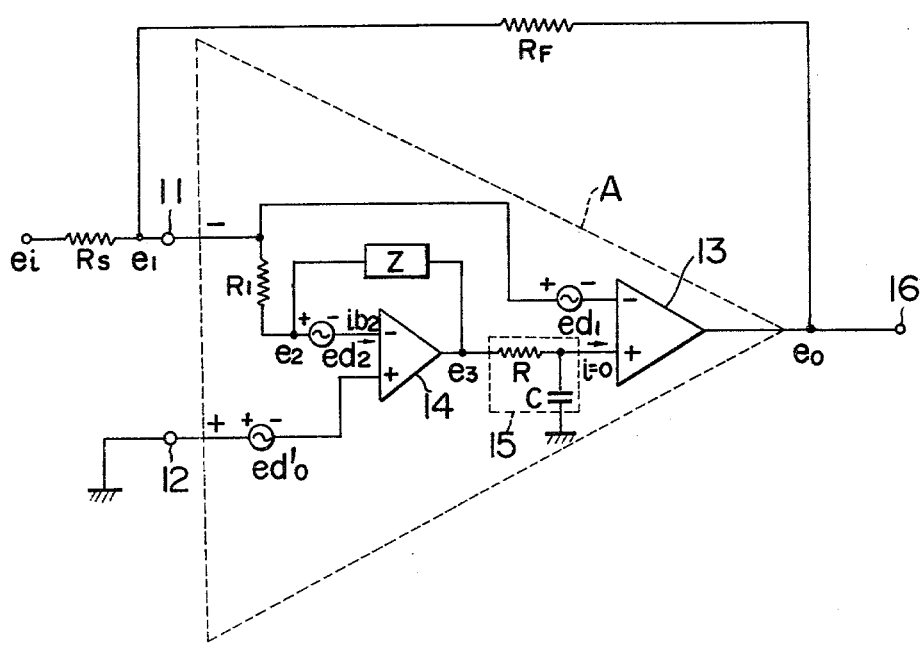
FIG. 3 is a view showing an equivalent circuit of the circuit shown in FIG. 2 and an external circuit thereof.

The above-mentioned input values $ed_1$ and $ed_2$, as shown in FIG. 3, can be regarded as output voltages of power sources which are connected respectively to the inverting input terminal of the wide-band operational amplifier 13 and that of the low-frequency operational amplifier 14. As shown in FIG. 3, when reference character $e_i$ indicates an input voltage, $e_1$ a voltage at the inverting input terminal 11, $G_1$ a voltage gain of the low-frequency operational amplifier 14, $ib_2$ an electric current flowing in the inverting input terminal of the amplifier 14, $e_2$ a voltage at a juncture between the resistor $R_1$ and a feedback impedance Z (which is made up of the resistor $R_2$ and capacitor $C_1$ shown in FIG. 2), $e_3$ an output voltage of the low-frequency operational amplifier 14, $e_o$ an output voltage of the operational amplifier A, and $G_2$ a voltage gain of the wide-band operational amplifier 13, and when an electric current i flowing in the non-inverting input terminal of the amplifier 13 is made equal to zero, there are provided the following equations:

$$\frac{e_i - e_0}{R_S} = \frac{e_1 - e_0}{R_F} + \frac{e_1 - e_2}{R_1} \quad (3)$$

$$\frac{e_1 - e_2}{R_1} = \frac{e_2 - e_3}{R_2} + i b_2 \quad (4)$$

$$e_3 = -G_1(e_2 - ed_2) \quad (5)$$

$$e_0 = -G_2(e_1 - ed_1 - e_3) \quad (6)$$

The voltages $e_1$, $e_2$ and $e_3$ are eliminated from equations (3), (4), (5) and (6), assuming the relations $G_1 = G_2 = \infty$. Then, the output voltage $e_o$ is expressed by the following equation:

$$e_0 = -\frac{R_F}{R_S} e_i + \left(\frac{1}{R_S} + \frac{1}{R_F}\right) R_F \cdot ed_2 + \frac{R_1 Z}{R_1 + Z}\left(1 + \frac{R_F}{R_S} + \frac{R_F}{R_1}\right)\left(\frac{ed_1}{Z} + ib_2\right) \quad (7)$$

By setting such conditions as $$\frac{1}{R_S} + \frac{1}{R_F} >> \frac{1}{R_1}$$

and $R_1 << |Z|$, equation (7) is converted into the following equation:

$$e_0 \cong -\frac{R_F}{R_S} e_i + \left(1 + \frac{R_F}{R_S}\right)\left(ed_2 + \frac{R_1}{Z} ed_1 + R_1 \cdot ib_2\right).$$

Further, the following equation is obtained using the relations $$\frac{R_1}{Z} = \frac{R_1}{R_2}(1 + SC_1R_2) = \frac{1}{g}.$$

$$e_0 \cong -\frac{R_F}{R_S} e_i + \left(1 + \frac{R_F}{R_S}\right)\left(ed_2 + \frac{ed_1}{g} + R_1 \cdot ib_2\right) \quad (8)$$

The formula $$\left(ed_2 + \frac{ed_1}{g} + R_1 \cdot ib_2\right),$$

which can be also indicated be $ed'_o$, appearing at the second term of equation (8), as shown in FIG. 3, indicates a resultant value of voltage-offset and drift values of the operational amplifier A, which is expressed in terms of input value at the non-inverting input terminal of the amplifier A, in a case when the input voltage $e_i$ is made equal to zero (or ground potential). Let us assume that the current $ib_2$ flowing in the low-frequency operational amplifier 14 is sufficiently small. Then, the following relations are obtained, which are identical with equation (2).

$$ed_0' \cong ed_2 + \frac{ed_1}{g} = ed_0$$

As is apparent from equation (2), when the transfer function g of the coefficient circuit is made large, the input value $ed_o$ becomes nearly equal to $ed_2$. That is, the input value $ed_1$ corresponding to large voltage-offset and drift values is substantially made small, and the input value $ed_o$ is determined by only the input value $ed_2$ which is far smaller than the input value $ed_1$. Thus, a low-drift operational amplifier can be provided.

Next, explanation will be made on the frequency characteristic of the circuit shown in FIG. 2.

When this circuit is employed in a state that the output terminal is grounded, or in a state approximate thereto, for example, when the circuit is employed as an additive coefficient circuit effecting polarity inversion or as an inverter, the wide-band operational amplifier 13 itself is never degraded in the wide-band characteristic. However, since the output impedance of the low-frequency operational amplifier 14 becomes large in a high frequency region, the step response of the wide-band operational amplifier 13 is deteriorated, and thus the wide-band characteristic is degraded. In order to overcome such a drawback, the low pass filter 15 is employed which is made up of a resistor R and a capacitor C. In more detail, since the output impedance of the low pass filter 15 is sufficiently low in the high frequency region, high-frequency noise is absorbed in the low pass filter 15, and therefore the wide-band characteristic of the amplifier 13 is not adversely affected by the preceding amplifier 14.

Further, the low pass filter 15 is indispensable to prevention of oscillation in a case (ii) which will be mentioned later. When the cut-off frequencies of the wide-band operational amplifier 13, the low-frequency operational amplifier 14 and the coefficient circuit (made up of the operational amplifier 14, the resistor $R_2$ and the capacitor $C_1$) are given by $f_{cl}$, $f_{c2}$ and $f_1$, respectively, oscillation of the circuit shown in FIG. 2 is prevented by selecting the circuit elements so as to satisfy a relation $f_2 \leq f_{cl} \leq f_3$ in a case (i) where $f_{cl} > f_1$ and to satisfy a relation $f_4 < f_{cl} < f_1$ in a case (ii) where $f_{cl} < f_1$, where $$f_1 = \frac{1}{2\pi C_1 R_2},$$

$$f_2 = \frac{1}{2\pi C_1 R_1}, f_3 = \frac{1}{2\pi CR}, f_4 = \frac{K}{2\pi CR}, \text{ and } K = \frac{R_2}{R_1}.$$

Next, explanation will be made on the reason why the oscillation is prevented.

Referring to FIG. 2, when voltage-transfer-functions of the coefficient circuit (made up of the low-frequency operational amplifier 14, the resistor $R_2$ and the capacitor $C_1$), the low pass filter 15 and the wide-band operational amplifier 13 are expressed by $G_1$, k and $G_2$, respectively, the composite voltage-transfer-function $G_o$ of the operational amplifier A is given by the following equation:

$$G_o = G_2(I + kG_1) \quad (9)$$

In order for the operational amplifier A, which is connected to the series resistor $R_S$ and the feedback resistor $R_F$ as shown in FIG. 3 and is used as an inverting amplifier, to be prevented from oscillating, the composite transfer function $G_o$ is required to have a time lag of the first order. In a case where the relation shown in the case (i) is satisfied, the voltage-transfer-functions $G_1$, $G_2$ and k have such frequency characteristics as indicated by solid lines in FIG. 4. Accordingly, a term $(1+kG_1)$ has a frequency characteristic such as indicated by a broken line, and the composite transfer function $G_o$, as indicated by a dot-dash line, includes a portion having no frequency characteristic and a portion having a time lag of first order. That is, a phase lag corresponding to the above frequency characteristic of the composite transfer function $G_o$ is less than $\pi/2$, and therefore, the circuit shown in FIG. 3 is not allowed to oscillate.

Figure 5:
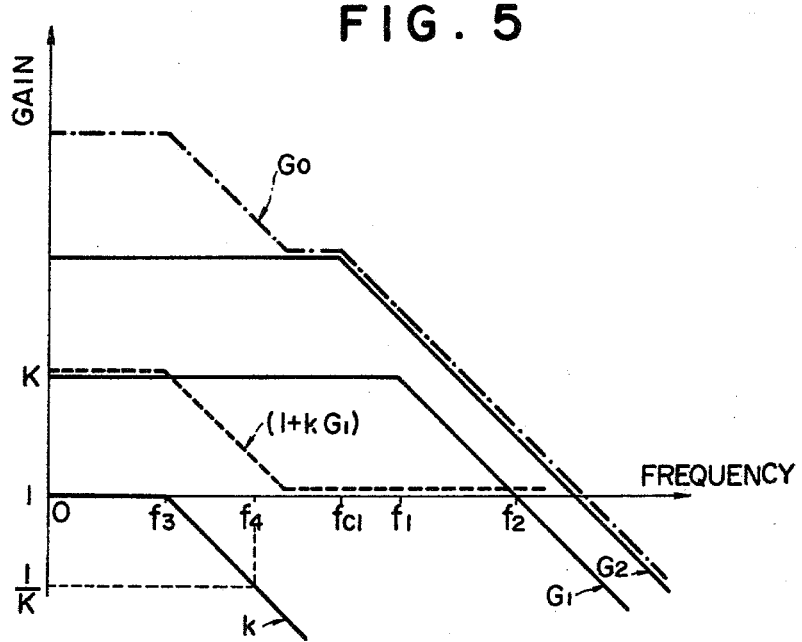

Similarly, in a case where the relation shown in the case (ii) is satisfied, the voltage-transfer-functions $G_1$, $G_2$ and k have such frequency characteristics as indicated by solid lines in FIG. 5. Accordingly, the term $(1+kG_1)$ has a frequency characteristic indicated by a broken line, and the composite transfer function $G_o$, as indicated by a dot-dash line, includes a portion having no frequency characteristic and a portion having a time lag of first order. That is, a phase lag corresponding to the frequency characteristic of the composite transfer function $G_o$ is less than $\pi/2$, and the operational amplifier A shown in FIG. 3 is never allowed to oscillate.

Figure 4:
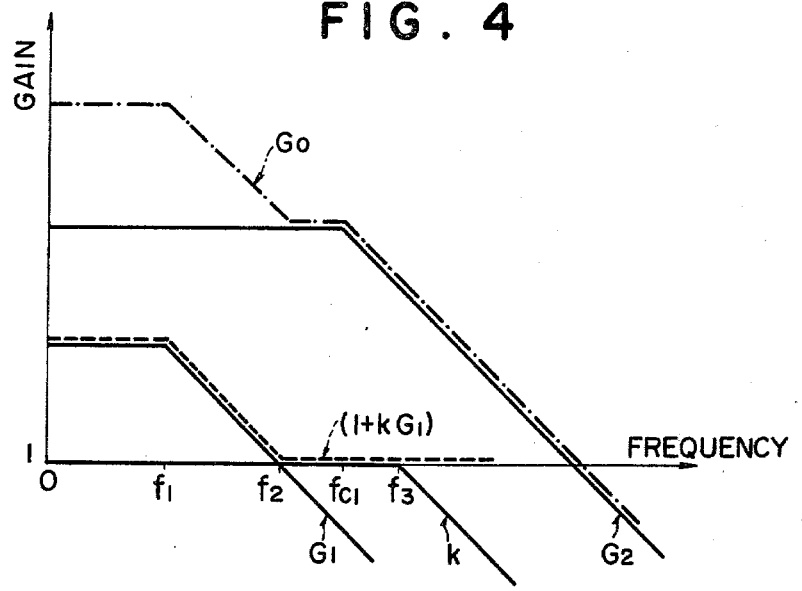
FIGS. 4 and 5 are graphs showing frequency characteristics of voltage gain of an operational amplifier according to the present invention.

The frequency characteristic of the composite transfer function which corresponds to the case (i) and is shown in FIG. 4, can be realized by appropriately selecting the circuit elements, even if the low pass filter 15 is not employed. However, the composite transfer function $G_o$ corresponding to the case (ii) and shown in FIG. 5 can include the portion having a time lag of first order by inserting the low pass filter 15 between the operational amplifiers 13 and 14. That is, the low pass filter 15 is indispensible to prevention of oscillation in this case.

Next, the effect of the present invention will be explained by reference to FIG. 6.

Figure 1:
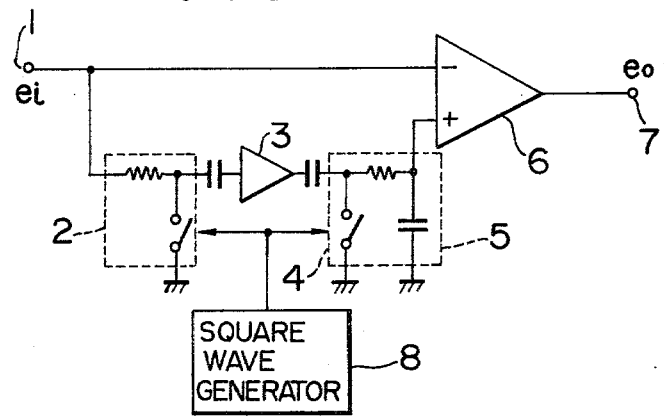
FIG. 1 is a circuit diagram of a conventional operational amplifier.
Figure 6:
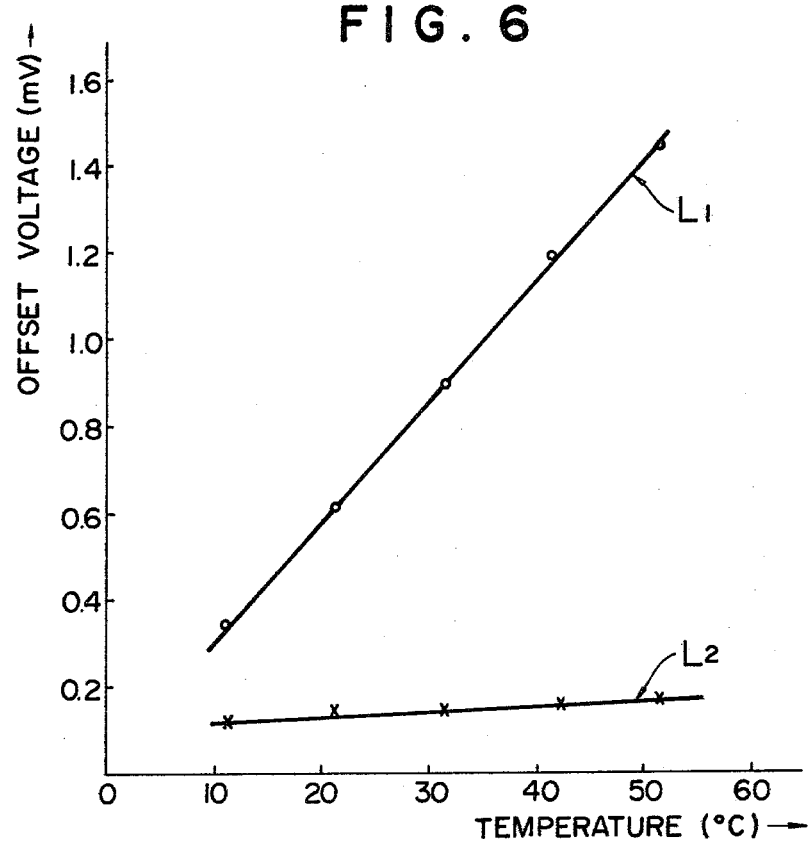
FIG. 6 is a graph showing the results of experiments which were made to confirm the effect of the present invention on the improvement of drift.

Referring to FIG. 6 which shows the variation of offset voltage with temperature, marks 0 indicate measured offset voltages in a case where a drift compensating circuit according to the present invention was not employed. A straight line $L_1$ which is obtained from these measured values through the method of least squares, shows that the offset voltage had a temperature coefficient of 26 $\mu V/°C$. in this case. While, marks X indicate measured values in a case where the compensating circuit of the present invention was employed. A straight line $L_2$ obtained from the measured values shows that the offset voltage had a temperature coefficient of 1.2 $\mu V/°C$. or less. As is evident from the above experiments, a wide-band operational amplifier which is provided with a drift compensating circuit according to the present invention, can be made equal to or less than 1.2 $\mu V/°C$. in temperature coefficient of offset voltage.

As has been explained hereinbefore, according to the present invention, a wide-band operational amplifier, a low-frequency operational amplifier having a low-drift characteristic, and a low pass filter are combined with each other to form a high-speed low-drift operational amplifier which has not hitherto been realized by a single operational amplifier. Needless to say, such a high-speed low-drift operational amplifier can produce a remarkable effect in various technical fields.

We claim:

1. An operational amplifier comprising:
   first and second input terminals;
   a coefficient circuit connected to said first and second input terminals and including a first operational amplifier, said first operational amplifier having a low drift characteristic;
   a low pass filter connected to receive the output of said coefficient circuit; and
   a second wide-band operational amplifier having first and second inputs and being connected to receive at one of the inputs thereof the output of said low pass filter and connected to receive at the other input thereof a signal applied to said first input terminal; wherein said coefficient circuit includes said first operational amplifier having first and second inputs and being connected to receive at one of the inputs thereof a signal applied to said second input terminal, a resistive element connected between said first input terminal and the other input of said first operational amplifier, and an impedance element connected between the said other input and the output of said first operational amplifier.

2. An operational amplifier according to claim 1, wherein said impedance element is made up of a resistor and a capacitor connected in parallel.

3. An operational amplifier circuit comprising:
   a high speed operational amplifier having inverting and non-inverting inputs and an output;
   a first input terminal connected to one input of said high speed operational amplifier;
   a second input terminal;
   an output terminal connected to the output of said high speed operational amplifier;
   an auxiliary amplifier of low drift characteristic with two inputs and an output, the two inputs of which are connected to said first and second input terminals respectively; and
   a low pass filter which is composed of a resistor connected between the output of said auxiliary amplifier and the other input of said high speed operational amplifier and a capacitor connected between said other input of said high speed operational amplifier and a voltage source.

4. An operational amplifier circuit according to claim 3, wherein said auxiliary amplifier comprises an operational amplifier of low drift characteristic having an inverting input and a non-inverting input and an output, a resistor connected between said first input terminal and said inverting input of said auxiliary amplifier, and a time constant circuit connected between said inverting input of said auxiliary amplifier and said output of said operational amplifier.

5. An operational amplifier circuit according to claim 4, wherein said time constant circuit is made up of a resistor and a capacitor connected in parallel.

* * * * *